US012774917B2

(12) United States Patent
Miguel Sánchez

(10) Patent No.: US 12,774,917 B2
(45) Date of Patent: Oct. 27, 2026

(54) APPARATUS FOR MONITORING MECHANICAL INTEGRITY OF AN EYE-SAFETY COMPONENT OF AN ILLUMINATOR

(71) Applicant: AMS-OSRAM ASIA PACIFIC PTE. LTD., Singapore (SG)

(72) Inventor: Javier Miguel Sánchez, Zurich (CH)

(73) Assignee: AMS-OSRAM ASIA PACIFIC PTE. LTD., Singapore (SG)

( * ) Notice: Subject to any disclaimer, the term of this patent is extended or adjusted under 35 U.S.C. 154(b) by 995 days.

(21) Appl. No.: 17/778,417

(22) PCT Filed: Nov. 16, 2020

(86) PCT No.: PCT/SG2020/050664
§ 371 (c)(1),
(2) Date: May 20, 2022

(87) PCT Pub. No.: WO2021/107862
PCT Pub. Date: Jun. 3, 2021

(65) Prior Publication Data

US 2022/0412794 A1 Dec. 29, 2022

Related U.S. Application Data

(60) Provisional application No. 62/941,962, filed on Nov. 29, 2019.

(51) Int. Cl.
*H01S 5/02257* (2021.01)
*G01H 9/00* (2006.01)
(Continued)

(52) U.S. Cl.
CPC ........... *G01H 9/00* (2013.01); *H01S 5/02257* (2021.01); *H01S 5/042* (2013.01); *H01S 5/06825* (2013.01); *H01S 5/183* (2013.01)

(58) Field of Classification Search
None
See application file for complete search history.

(56) References Cited

U.S. PATENT DOCUMENTS 5,085,080 A * 2/1992 Yu .......................... G01K 11/26
73/579
11,073,440 B2 * 7/2021 Lee ....................... H01S 5/0222
(Continued)

FOREIGN PATENT DOCUMENTS

CN 103561638 A 2/2014
CN 103584883 A 2/2014
(Continued)

OTHER PUBLICATIONS

Chinese Office Action issued for the corresponding CN patent application No. CN 202080082935.2, dated Jan. 26, 2025, 6 pages (For informational purposes only).
(Continued)

*Primary Examiner* — Tod T Van Roy
(74) *Attorney, Agent, or Firm* — Viering, Jentschura & Partner mbB

(57) ABSTRACT

An apparatus for monitoring mechanical integrity of an eye-safety component of an illuminator is disclosed. The apparatus comprises a sensor, operable to sense a photoacoustic effect in the eye-safety component during operation of the illuminator and to output a signal representative of the sensed photoacoustic effect, and a processor. The processor is operable to: monitor the signal from the sensor; determine if the signal comprises at least one parameter that falls outside of a pre-determined acceptable range, the pre-determined acceptable range being indicative of mechanical integrity of the eye-safety component; and initiate a safety action in response to a determination that the at least one
(Continued)

parameter falls outside of the pre-determined acceptable range thereby indicating a loss of mechanical integrity.

20 Claims, 4 Drawing Sheets

(51) Int. Cl.
*H01S 5/042* (2006.01)
*H01S 5/068* (2006.01)
*H01S 5/183* (2006.01)

(56) References Cited

U.S. PATENT DOCUMENTS

| | | | | |
|---|---|---|---|---|
| 11,862,936 | B2 * | 1/2024 | Iwahama | G01S 7/4814 |
| 12,021,349 | B2 * | 6/2024 | Johnson | H01S 5/0264 |
| 2008/0180643 | A1 | 7/2008 | Endo et al. | |
| 2009/0007675 | A1 * | 1/2009 | Hammann | G01K 11/24 73/597 |
| 2012/0242974 | A1 * | 9/2012 | LaValley | G01S 17/87 367/99 |
| 2014/0049190 | A1 | 2/2014 | Oh | |
| 2014/0145648 | A1 | 5/2014 | Tokita et al. | |
| 2016/0313288 | A1 * | 10/2016 | Theuss | G01N 29/2425 |
| 2016/0377969 | A1 | 12/2016 | Nishimori et al. | |
| 2017/0258332 | A1 | 9/2017 | Wynn et al. | |
| 2017/0353004 | A1 * | 12/2017 | Chen | H01S 5/02234 |
| 2018/0235456 | A1 | 8/2018 | Karakaya et al. | |
| 2019/0296522 | A1 * | 9/2019 | Johnson | H01S 5/02257 |
| 2019/0339234 | A1 * | 11/2019 | Finn | G01N 29/043 |
| 2020/0013160 | A1 * | 1/2020 | Francis | G06T 7/0004 |
| 2020/0041372 | A1 * | 2/2020 | Lee | H01S 5/02257 |
| 2020/0049339 | A1 * | 2/2020 | Tsai | F21V 3/061 |
| 2022/0397483 | A1 * | 12/2022 | Mccord | G01N 29/043 |
| 2022/0412794 | A1 * | 12/2022 | Miguel Sánchez | A61B 5/0095 |
| 2023/0094981 | A1 * | 3/2023 | Miguel Sánchez | G01H 1/12 73/570 |

FOREIGN PATENT DOCUMENTS

| | | | |
|---|---|---|---|
| CN | 107920733 | A | 4/2018 |
| CN | 109379460 | A | 2/2019 |
| DE | 102015106373 | A1 | 10/2016 |
| JP | H03165257 | A | 7/1991 |
| JP | H07326210 | A | 12/1995 |
| JP | 2008180921 | A | 8/2008 |
| WO | 2015141044 | A1 | 9/2015 |
| WO | 2017025325 | A1 | 2/2017 |
| WO | 2018156412 | A1 | 8/2018 |
| WO | 2019152462 | A1 | 1/2019 |

OTHER PUBLICATIONS

Vollinger, Martin, International Search Report and Written Opinion of the International Searching Authority, for counterpart application PCT/EP2019/081885, Jun. 3, 2021, European Patent Office, Rijswijk, The Netherlands (5 pages).

Jeen, J A M, et al., “Two techniques for early detection of pulsed laser induced damage in optical materials”, Journal of Physics E. Scientific Instruments, IOP Publishing, Bristol, GB, vol. 17, No. 3, Mar. 1, 1984 (Mar. 1, 1984), XP020017332, ISSN: 0022-3735, DOI: 10.1088/0022-3735/17/3/005 abstract p. 191, left-hand column, paragraph 1-paragraph 5 (pp. 191-193).

“Research Disclosure”, Kenneth Mason Publications, Hampshire, UK, GB, vol. 613, No. 20, May 1, 2015 (May 1, 2015), p. 2, XP007144062, ISSN: 0374-4353 [retrieved on Mar. 30, 2015] (3 pages).

English Abstract of CN 109379460 downloaded from Espacenet on Apr. 22, 2022 (1 page).

Optical Society of America APA citation: New technology uses lasers to transmit audible messages to specific people (Jan. 23, 2019) retrieved Jul. 16, 2021 from https://phys.org/news/2019-01-technology-lasers-transmit-audible-messages.html (2 pages).

McClelland, John F., et al., Capacitive MEMS Microphone Optimized for PAS Applications, U.S. Army Research Office, Contract/Grant No. W911NF-05-C-0009, Apr. 8, 2005 (22 pages).

Progress in Photothermal and Acoustic Science and Technology, Life and Earth Sciences, A. Mandelis and P. Hess, SPIE (1997)—Chapter 1, (15 pages).

Setiawan, Andreas, et al., Surface Crack Detection with Low-Cost Photoacoustic Imaging System, International Journal of Technology (2018) 1: 159-169 ISSN 2086-9614 (11 pages).

Tam, Andrew C., Applications of Photoacoustic Sensing Techniques, IBM Almaden Research Center, San Jose, California 95120-6099, Reviews of Modern Physics, vol. 58, No. 2, Apr. 1986 (54 pages).

JP Search Report by Registered Organization issued for the corresponding JP patent application No. JP2022532050, dated Sep. 20, 2024, 38 pages (For informational purposes only).

* cited by examiner

APPARATUS FOR MONITORING MECHANICAL INTEGRITY OF AN EYE-SAFETY COMPONENT OF AN ILLUMINATOR

TECHNICAL FIELD OF THE DISCLOSURE

The disclosure relates to an apparatus and method for monitoring mechanical integrity of an eye-safety component of an illuminator. The disclosure also relates to an illuminator incorporating the apparatus and a device incorporating the illuminator.

BACKGROUND OF THE DISCLOSURE

There is a current trend of using three-dimensional sensing for face recognition and world facing applications. Such sensing systems require illuminators to flood the subjects to be imaged with light and often employ high power lasers. When the laser is packaged correctly in a suitable optics module, it is eye-safe. However, if the module integrity is compromised, the illuminator may no longer be eye-safe and, in which case, there is a demand for an interlock to trigger an eye-safety mechanism.

To date, the integrity of an illuminator module has been assessed using a photodiode back reflection from the cover optics or using an indium tin oxide (ITO) layer on the cover optics and measuring either capacitance or DC resistance of the ITO layer.

More specifically, a capacitive sensor is used to detect a change in capacitance resulting from a crack in the coated cover optics, which in turn may lead to eye damage. However, the presence of large currents (e.g. up to 3 A) for driving the laser in an illuminator in very short pulses (>100 MHz) make measurement of small values (typically around 1 pF) associated with the capacitance of the ITO layer extremely difficult.

It is possible to check the DC resistivity of a resistive sensor in order to check the integrity of the cover optics where the conductive ITO layer is provided. However, the conductive ITO layer must be outside of the field of illumination so any damage to the portion of the cover optics, which is not coated, may not be detected. In addition, the use of a DC resistivity measurement can be compromised by a natural high noise environment due to electromagnetic interference (EMI), especially if a DC threshold readout is used.

It is therefore an aim of the present disclosure to provide an apparatus and method for monitoring mechanical integrity of an eye-safety component of an illuminator, which address one or more of the problems above or at least provides a useful alternative.

SUMMARY

In general, this disclosure proposes to overcome the above problems by utilising the photoacoustic effect to probe the mechanical properties of the cover optics, thereby directly monitoring the integrity of the eye-safety component in the area being illuminated.

According to one aspect of the present disclosure, there is provided an apparatus for monitoring mechanical integrity of an eye-safety component of an illuminator, the apparatus comprising:

- a sensor operable to sense a photoacoustic effect in the eye-safety component during operation of the illuminator and to output a signal representative of the sensed photoacoustic effect; and

- a processor operable to:
  - monitor the signal from the sensor;
  - determine if the signal comprises at least one parameter that falls outside of a pre-determined acceptable range, the pre-determined acceptable range being indicative of mechanical integrity of the eye-safety component; and
  - initiate a safety action in response to a determination that the at least one parameter falls outside of the pre-determined acceptable range thereby indicating a loss of mechanical integrity.

Thus, embodiments of this disclosure provide an apparatus for monitoring mechanical integrity of an eye-safety component of an illuminator, which can be used to provide a safety interlock, which is triggered when a photoacoustic signal changes in response to a mechanical change in the eye-safety component itself. As the photoacoustic effect is generated by a light signal from the illuminator passing through the eye-safety component, the apparatus monitors the exact portion of the eye-safety component through which the light travels thereby probing the mechanical integrity of the medium in the precise region where eye safety is critical. This is in contrast to prior art systems where any monitoring is performed by probing electrical signals from areas that are close to but not co-existent with the critical eye-safety components. In addition, aspects of the disclosure allow for continuous monitoring of window integrity in an illuminator via photoacoustic signalling.

In some embodiments, the photoacoustic effect will result directly from operation of an emitter such that the photoacoustic effect is synchronised with operation of the emitter. Accordingly, if the emitter is pulsed, the photoacoustic effect will also generate a pulsed signal within a well-defined detection window. In another embodiment, the photoacoustic effect may result from continuous operation of the emitter. In some embodiments, the frequency of the emitter can be modulated to sweep a range of frequencies or to probe particular frequencies.

Accordingly, aspects of the present disclosure provide an apparatus for monitoring mechanical integrity of an eye-safety component, such as those present in illuminators configured for 3D sensing applications, and for initiating a safety action in response to a loss in integrity thereby providing a safety interlock.

The sensor may be configured to sense a sound wave formed by the photoacoustic effect.

A phononic structure may be configured to improve a signal-to-noise ratio of the sound wave. In other words, the phononic structure may enhance a signal, created by the photoacoustic effect, in the eye-safety component itself or in a path leading from the eye-safety component to the sensor. In some embodiments, the phononic structure may be provided in, on, at, adjacent, around or interlaced with the eye-safety component (i.e. the phononic structure may be separate to or integrated in structures forming the eye-safety component).

The processor may be further operable to detect a change in environmental conditions within the illuminator based on the signal from the sensor.

The processor may be operable to initiate the safety action by transmitting an instruction to the illuminator to modify an intensity of illumination.

The processor may be operable to initiate the safety action by transmitting an instruction to the illuminator to cease illumination. Thus, the apparatus may be configured for automatic power control of the illuminator.

The sensor may comprise at least one microphone.

The apparatus may further comprise one or more of: an amplifier; a filter; a lock-in detector; and an acceptable range detector.

According to a second aspect of this disclosure, there is provided an illuminator comprising:

at least one emitter;

an eye-safety component providing a shield between the at least one emitter and a user; and the apparatus according to the first aspect of the disclosure.

The illuminator may further comprise a modulator configured to modulate a light output from at least one of the at least one emitter at a pre-determined frequency and wherein the processor is operable to use the pre-determined frequency in a lock-in detection method and/or a gated detection method when monitoring the signal from the sensor.

The at least one emitter may comprise an illumination emitter and the sensor is operable to sense a photoacoustic effect resulting from operation of the illumination emitter.

The at least one emitter may comprise a monitoring emitter and the sensor is operable to sense a photoacoustic effect resulting from operation of the monitoring emitter.

The sensor may be arranged to sense the photoacoustic effect in the eye-safety component directly.

The sensor may be arranged to sense the photoacoustic effect in the eye-safety component indirectly by receiving an input via a waveguide or other medium 160.

The at least one emitter may comprise a laser.

The eye-safety component may comprise a glass substrate and/or a diffuser.

The illuminator may be provided in a package or module. The package or module may be airtight or hermetic. A hermetic package may contain a well-defined fluid (e.g. gas) through which a photoacoustic signal travels such that any leaks or ingression could be detected by a change in the photoacoustic signal.

The processor may be included in the package/module or may be provided externally, for example, elsewhere in a device incorporating the illuminator. Where an external processor is used, it will be configured for communication with the sensor and emitter, at least.

The sensor (e.g. microphone) may be located on or close to the eye-safety component to ensure a quick response and good signal quality. The sensor may be provided (i.e. secured in place) on a portion of the eye-safety component (e.g. diffuser or glass substrate) and metallic traces provided to route electrical signals from the sensor to an edge of the package and along sidewalls to a substrate on which the processor and/or emitter is located.

In some embodiments, a phononic or acoustic filter 150 may be provided (e.g. on the eye-safety component or elsewhere in the package) to maximize a photoacoustic signal strength along a path to the sensor.

The sensor may be provided in a general integrated circuit (IC) or an application-specific integrated circuit (ASIC) together with other components for example, for performing the functions of amplifying, filtering, lock-in detection, threshold detection and signalling output for the safety action.

According to a third aspect of this disclosure, there is provided a device comprising an apparatus according to the first aspect of the disclosure or an illuminator according to the second aspect of the disclosure.

According to a fourth aspect of this disclosure, there is provided a method for monitoring mechanical integrity of an eye-safety component of an illuminator, the method comprising:

obtaining, from a sensor, a signal representative of a sensed photoacoustic effect in the eye-safety component during operation of the illuminator;

monitoring the signal;

determining if the signal comprises at least one parameter that falls outside of a pre-determined acceptable range, the pre-determined acceptable range being indicative of mechanical integrity of the eye-safety component; and initiating a safety action in response to a determination that the at least one parameter falls outside of the pre-determined acceptable range thereby indicating a loss of mechanical integrity.

The method may further comprise establishing the pre-determined acceptable range (e.g. threshold value).

The pre-determined acceptable range may be established by a controller, which may be provided in the illuminator or external thereof (for example, in a host device).

The pre-determined acceptable range may be based on predefined values stored in a memory and/or defined during a calibration step. The predefined values may comprise one or more parameters, which may be adjusted during the calibration step. For example, the parameters may comprise signal amplitude, signal frequency or signal wavelength.

The pre-determined acceptable range may be established using an artificial neural network (ANN).

According to a fifth aspect of this disclosure, there is provided a non-transitory computer-readable medium having stored thereon program instructions for causing at least one processor to perform the method according to the fourth aspect of the disclosure.

As discussed above, prior art systems tend to have problems associated with the measurement of small values and the fact that the area monitored is not the same as the area through which the emitted, and potentially damaging, light passes.

Compared to such known systems, the present apparatus for monitoring mechanical integrity of an eye-safety component of an illuminator disclosed here has the following advantages:

1. It can precisely probe the area illuminated by the emitter (which is safety critical) as the photoacoustic effect is generated by the use of the emitter itself.
2. It can monitor the mechanical status of the eye-safety component itself (i.e. the glass window).
3. It can be robust to noise, for example, due to the monitoring of a reduced bandwidth from a lock-in detection method and well-defined time window.
4. It is sensitive only to the excitation frequency of the emitter (i.e. the signal which could cause eye safety concerns is also the signal which causes the effect being monitored to check the eye safety).
5. It can be used to monitor species inside the illuminator package (e.g. to detect leakage or ingress).

Finally, the present apparatus for monitoring mechanical integrity of an eye-safety component of an illuminator disclosed here utilises a novel approach at least in that it harnesses the photoacoustic effect which is present under normal operation of the illuminator to provide an indication of the mechanical integrity of the eye-safety component in the area of primary concern.

BRIEF DESCRIPTION OF THE PREFERRED EMBODIMENTS

Some embodiments of the disclosure will now be described by way of example only and with reference to the accompanying drawings, in which.

DETAILED DESCRIPTION OF THE PREFERRED EMBODIMENTS

Generally speaking, the disclosure provides a method and apparatus for monitoring mechanical integrity of an eye-safety component of an illuminator, which harnesses the usually undesirable signal due to the photoacoustic effect of light passing through a cover glass or window as a means for monitoring whether the window is damaged.

Some examples of the solution are given in the accompanying figures.

Figure 1:
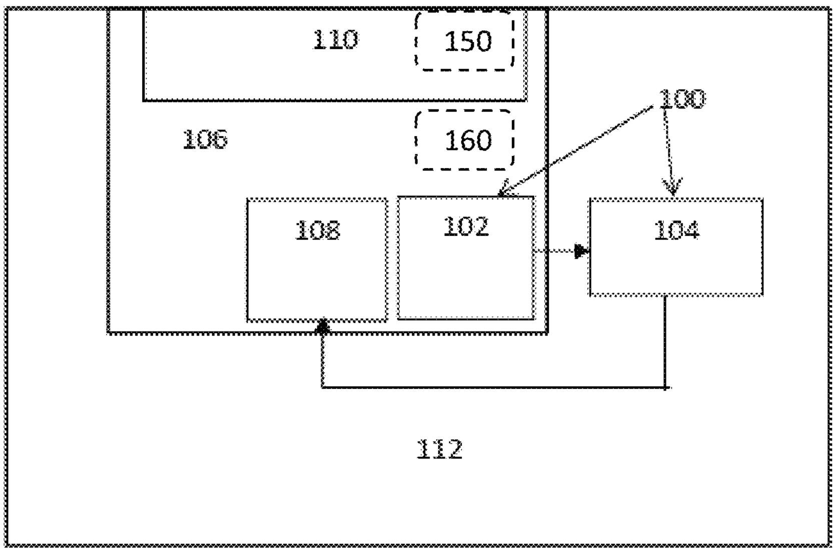
FIG. 1 shows a block diagram of a device having an illuminator and apparatus in accordance with the present disclosure.

FIG. 1 shows a block diagram of a device 112 having an illuminator 106 and apparatus 100 for monitoring mechanical integrity of an eye-safety component 110 of the illuminator 106, in accordance with the present disclosure. The device 112 may be, for example, a cellular telephone, tablet, laptop, watch, or other computing device.

The apparatus 100 comprises a sensor 102 in the form of a microphone and a processor 104. The sensor 102 is operable to sense a photoacoustic effect in the eye-safety component 110 during operation of the illuminator 106 and to output a signal representative of the sensed photoacoustic effect. The processor 104 is operable to: monitor the signal from the sensor 102; determine if the signal comprises at least one parameter that falls outside of a pre-determined acceptable range, the pre-determined acceptable range being indicative of mechanical integrity of the eye-safety component 110; and initiate a safety action in response to a determination that the at least one parameter falls outside of the pre-determined acceptable range, thereby indicating a loss of mechanical integrity.

The safety action may comprise transmitting an instruction to the illuminator 106 to modify an intensity of illumination (e.g. to lower the intensity to a safe level) or to cease illumination. The safety action may modify the wavelength of the illuminator 106 or switch the illumination from continuous to pulsed, for example.

The illuminator 106 comprises an emitter 108 as well as the eye-safety component 110. The eye-safety component 110 is configured to provide a shield between the emitter 108 and a user (not shown). The eye-safety component 110 may comprise a diffuser and/or a transparent window (e.g. cover glass).

Although the processor 104 is shown outside of the illuminator 106, it could be incorporated within the illuminator 106 and may be, for example, provided on an integrated circuit (IC) with the sensor 102 and/or the emitter 108.

Figure 2:
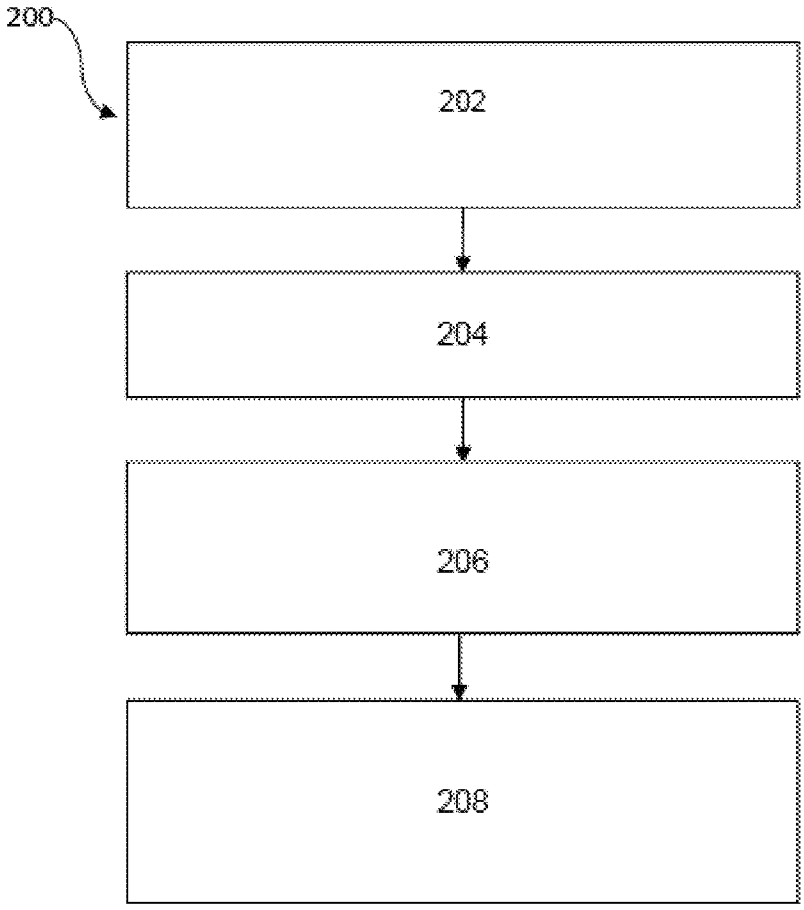
FIG. 2 shows a flow chart illustrating a method of monitoring mechanical integrity of an eye-safety component of the illuminator of FIG. 1.

FIG. 2 shows a method 200, which may be performed by the processor 104, for monitoring mechanical integrity of the eye-safety component 110. The method 200 comprises a step 202 of obtaining, from the sensor 102, a signal representative of a sensed photoacoustic effect in the eye-safety component 110 during operation of the illuminator 106 and a step 204 of monitoring the signal. A further step 206 comprises determining if the signal comprises at least one parameter that falls outside of a pre-determined acceptable range, the pre-determined acceptable range being indicative of mechanical integrity of the eye-safety component 110. A subsequent step 208 comprises initiating a safety action in response to a determination that the at least one parameter falls outside of the pre-determined acceptable range thereby indicating a loss of mechanical integrity.

The method may further comprise establishing the pre-determined acceptable range (e.g. a threshold value). The pre-determined acceptable range may be established by a controller, which may be provided in the illuminator or external thereof (for example, in a host device).

The pre-determined acceptable range may be of the following form: up to a predefined value; below a predefined value; between predefined values.

The pre-determined acceptable range may be based on predefined values stored in a memory and/or defined during a calibration step. The predefined values may comprise one or more parameters, which may be adjusted during the calibration step. For example, the parameters may comprise signal amplitude, signal frequency or signal wavelength.

In some embodiments, the pre-determined acceptable range may be established using an artificial neural network (ANN).

Figure 3:
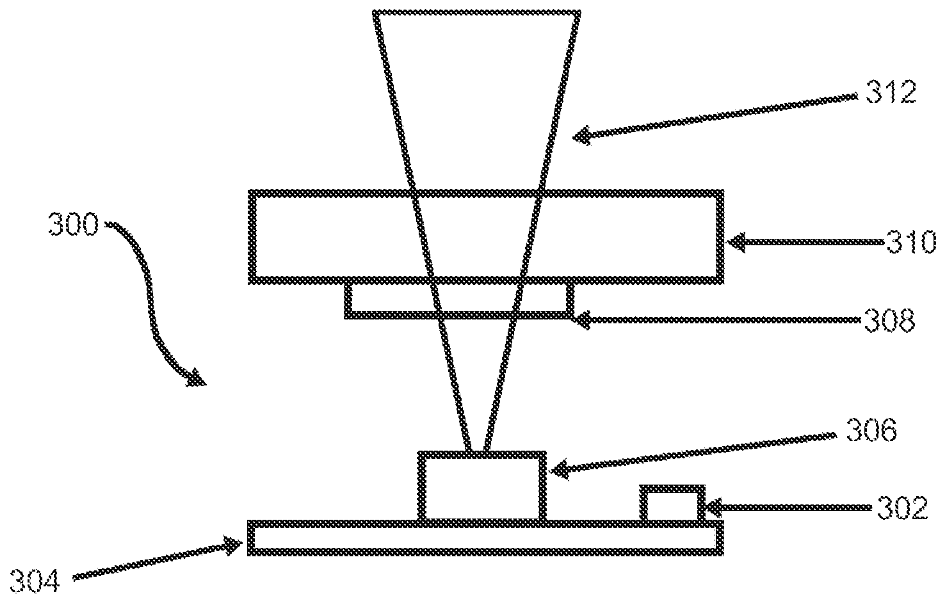
FIG. 3 shows a side schematic view of a first illuminator in accordance with the present disclosure.

FIG. 3 shows a side schematic view of a first (open) illuminator 300 in accordance with the present disclosure. The first illuminator 300 has a similar structure to that of the illuminator 106 and comprises a sensor 302, in the form of a microphone, mounted on a substrate 304. An emitter 306, in the form of a vertical cavity surface emitting laser (VCSEL), is also mounted on the substrate 304 and is arranged to emit light 312 through a diffuser 308 and glass window 310. Together, the diffuser 308 and glass window 310 form the eye-safety components 110.

Although not shown, a processor (similar to the processor 104 of FIG. 1), is provided in communication with the sensor 302 and emitter 306.

In use, the sensor 302 is operable to sense a photoacoustic effect in the diffuser 308 and/or glass window 310 during operation of the illuminator 300 (e.g. when the emitter emits a laser pulse) and to output a signal representative of the sensed photoacoustic effect to the processor. The processor is operable to: monitor the signal from the sensor 302; determine if the signal comprises at least one parameter that falls outside of a pre-determined acceptable range, the pre-determined acceptable range being indicative of mechanical integrity of the diffuser 308 and/or glass window 310; and initiate a safety action in response to a determination that the at least one parameter falls outside of the pre-determined acceptable range, thereby indicating a loss of mechanical integrity. As above, the safety action may comprise transmitting an instruction to the illuminator 300 to modify an intensity of illumination (e.g. to lower the intensity to a safe level) or to cease illumination.

Figure 4:
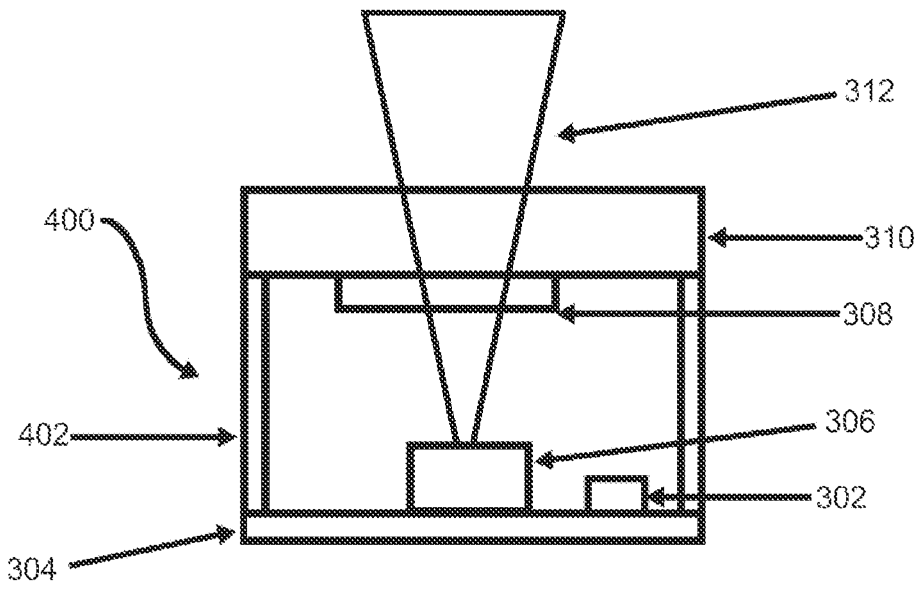
FIG. 4 shows a side schematic view of a second illuminator in accordance with the present disclosure.

FIG. 4 shows a side schematic view of a second (closed) illuminator 400 in accordance with the present disclosure. The second illuminator 400 is similar to the first illuminator 300 and therefore the same reference numerals are included to indicate similar features. Thus, in addition to the components described above in relation to FIG. 3, the second illuminator 400 is housed in a package or module including sidewalls 402 between the substrate 304 and the glass window 310. The second illuminator 400 may therefore be airtight or hermetically sealed and may contain a well-defined fluid (e.g. gas). In which case, the sensor 302 senses a photoacoustic signal generated in the diffuser and/or glass window 310, after it has travelled through the fluid such that any leaks or ingression (e.g. of water or other fluids) can be detected by a change in the photoacoustic signal.

Figure 5:
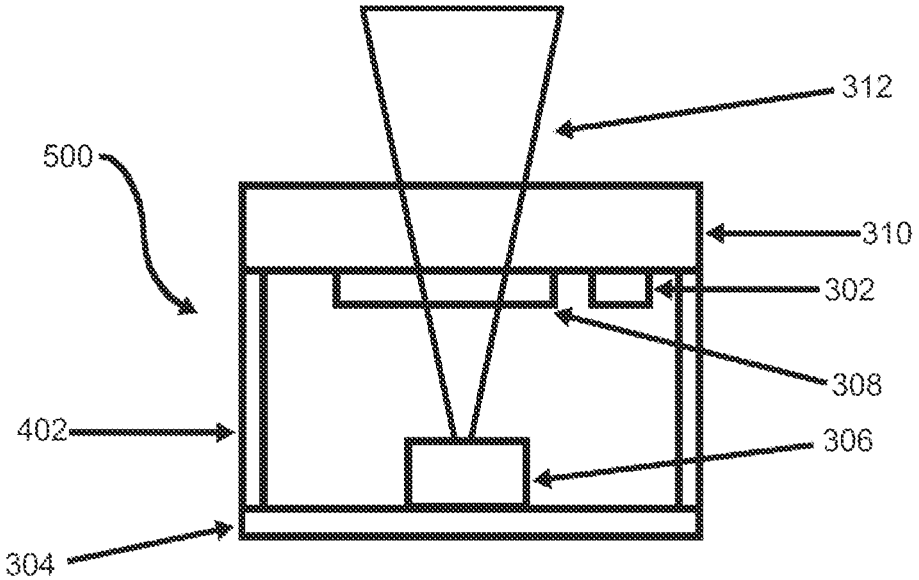
FIG. 5 shows a side schematic view of a third illuminator in accordance with the present disclosure.

FIG. 5 shows a side schematic view of a third (further) illuminator 500 in accordance with the present disclosure. The third illuminator 500 is similar to the second illuminator 400 and therefore the same reference numerals are included to indicate similar features. However, instead of the sensor 302 of FIG. 4 being mounted on the substrate 304, in FIG. 5, the sensor 302 is mounted on an enclosed surface of the glass window 310. Thus, the sensor 302 is mounted in direct contact with the eye-safety components. In other embodiments, the sensor 302 may be mounted in direct contact with the diffuser 308. In both cases, the sensor 302 is located on or close to the eye-safety component to ensure a quick response and good signal quality. Although not shown in FIG. 5, metallic traces or other electrical connectors (e.g. wires) may be provided to route electrical signals from the sensor 302 to an edge of the illuminator package and along the sidewalls 402 to the substrate 304 on which the emitter (and potentially also the processor) is located.

Figure 6:
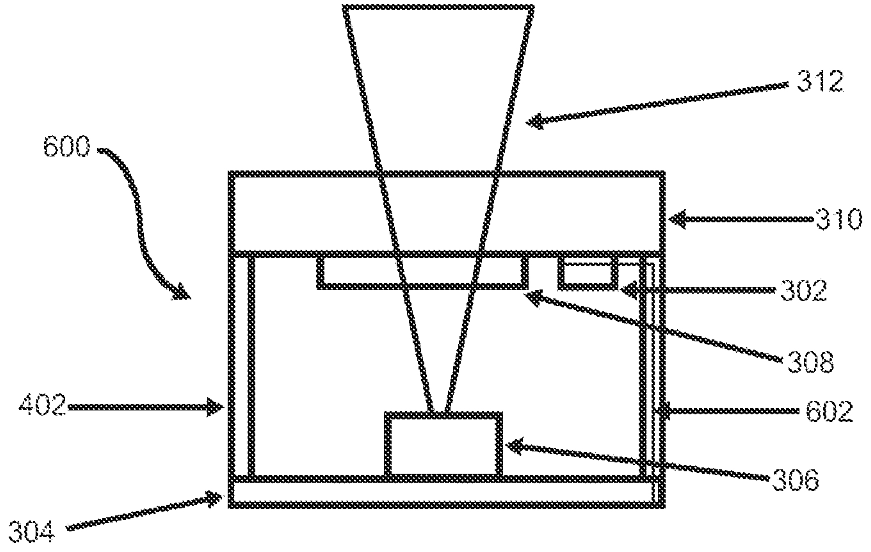
FIG. 6 shows a side schematic view of a fourth illuminator in accordance with the present disclosure.

FIG. 6 shows a side schematic view of a fourth (another) illuminator 600 in accordance with the present disclosure. The fourth illuminator 600 is similar to the third illuminator 500 and therefore the same reference numerals are included to indicate similar features. However, in this case, metallic traces (i.e. connectors) 602 providing a path for electrical signals from the sensor 302 to the substrate 304, are shown. In this way, the sensor 302 outputs a signal representative of the sensed photoacoustic effect and transmit this signal to the processor to monitor the signal from the sensor 302. As explained above, the processor will determine if the signal comprises at least one parameter that falls outside of a pre-determined acceptable range, the pre-determined acceptable range being indicative of mechanical integrity of the glass window 310. The processor also initiates a safety action in response to a determination that the at least one parameter falls outside of the pre-determined acceptable range, thereby indicating a loss of mechanical integrity. For example, the processor may transmit a trigger to shut-off power to the emitter 306 to prevent further illumination in the case of a loss of integrity of the eye-safety components.

Figure 7:
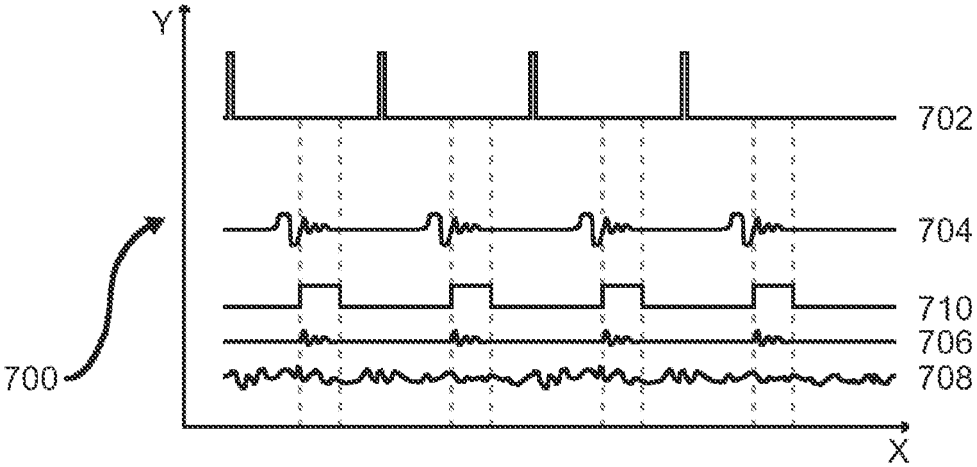
FIG. 7 shows a timing diagram illustrating different signals generated during operation of the illuminator of FIG. 1.

FIG. 7 shows a timing diagram 700 illustrating different signals generated during operation of the illuminator 106 of FIG. 1. It will be understood that the illuminators 300, 400, 500 and 600 may also operate in a similar manner. The timing diagram 700 includes an x-axis representing time and a y-axis representing signal amplitude/intensity. Arbitrary units (AU) are shown, as the diagram is for illustrative purposes only. The waveforms shown represent a light signal intensity 702, a photoacoustic signal amplitude 704, a gated photoacoustic signal amplitude 706, a noise signal amplitude 708, and a detection gate signal amplitude 710 which are purely illustrative and other shapes of these waveforms may be present in a real device.

The timing diagram 700 shows the pulsed laser light signal 702 from the emitter. This results in the photoacoustic signal 704 generated via the photoacoustic effect (whereby sound waves are formed following light absorption in a medium) when the light signal 702 passes through the eye safety components. The photoacoustic signal 704 propagates in the eye-safety components and is also transmitted through the sidewalls and enclosed medium. Accordingly, the photoacoustic signal 704 is sensed by the sensor, which is provided either on the eye-safety components or elsewhere in the illuminator. In the present embodiment, a gated detection method is used by generation of the detection gate signal 710, which is timed to isolate a portion of the photoacoustic signal 704, which is denoted as the gated photoacoustic signal 706, which results from transmission of the photoacoustic signal 704 in the eye-safety components. The gated photoacoustic signal 706, which is sensed by the sensor, is therefore the product of the detection gate signal 710 and the photoacoustic signal 704. In addition, as illustrated in FIG. 7, the noise signal 708 is also present.

In the present embodiment, the emitter will have a pre-determined wavelength suitable for a given application, which will not be tuned for absorbance in the eye-safety components. Accordingly, the photoacoustic signal 704 is not likely to be at a resonant frequency of the eye-safety components. Thus, photoacoustic signal 704 may be relatively small and the resulting gated photoacoustic signal 706 is similarly small.

As shown in FIG. 7, the gated photoacoustic signal 706 is delayed in time to the photoacoustic signal 704. This is solely a result of the speed of sound in the medium, and therefore it allows the parameters for the detection gate signal 710 to be easily determined. However, instead of using the detection gate signal 710 as shown in FIG. 7, a detection gate signal 710 that fully overlaps the photoacoustic signal 704 could be used.

By monitoring the photoacoustic signal 704 or the gated photoacoustic signal 706, it is possible to check the mechanical integrity of the eye-safety components. As sound waves are very sensitive to structural defects, it is possible to observe the status of the eye-safety components any time, while using the emitter.

In some embodiments, a second emitter may be provided solely for the purpose of generating the photoacoustic signal to be monitored. In this way, the second emitter could be tuned to the resonant frequency of the eye-safety components to make detection of the photoacoustic signal easier.

In experiments, an illuminator according to the present disclosure had an intensity of approximately 2 W using a current of around 3 A, which produced detectable signals representative of the mechanical integrity of the eye-safety components. For some applications, currents of up to 15 A may be employed, which would clearly provide detectable signals which could be monitored and used to trigger a shutdown of the powerful emitter if the integrity of the eye-safety component was detected.

Although the sensors may comprise standard microphones, a custom-made microelectromechanical system (MEMS) based microphone may be employed to achieve a sensitivity of up to 1-10V/Pa.

Although not shown, a phononic structure may be provided to improve a signal-to-noise ratio of the sound wave.

Thus, examples of the present disclosure provide a method and apparatus, which utilises the photoacoustic effect to probe the mechanical properties of eye-safety components for illuminators, to monitor the integrity of the eye-safety component and to perform a safety action such as a shutdown of the emitter if a change occurs.

Embodiments of the present disclosure can be employed in many different applications including world and front facing illuminators for 3D sensing (using e.g. time of flight (ToF), pattern or stereo approaches) or augmented reality, for example, in gaming, industrial, educational, automotive (e.g. for driver monitoring) and other industries.

LIST OF REFERENCE NUMERALS

100 apparatus
102 sensor
104 processor
106 illuminator
108 emitter
110 eye-safety component
112 device
200 method
202 step 1
204 step 2
206 step 3
208 step 4
300 first (open) illuminator
302 sensor
304 substrate
306 emitter
308 diffuser
310 glass window
312 laser beam
400 second (closed) illuminator
402 sidewall
500 third (further) illuminator
600 fourth (another) illuminator
602 connection
700 signal diagram
702 light signal intensity
704 photoacoustic signal amplitude
706 gated photoacoustic signal amplitude
708 noise amplitude
710 detection gate signal amplitude The skilled person will understand that in the preceding description and appended claims, positional terms such as 'above', 'along', 'side', etc. are made with reference to conceptual illustrations, such as those shown in the appended drawings. These terms are used for ease of reference but are not intended to be of limiting nature. These terms are therefore to be understood as referring to an object when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in any embodiments, whether alone or in any appropriate combination with any other feature disclosed or illustrated herein.

REFERENCES

Further background information relating to the present disclosure is referenced below.

1. Applications of photoacoustic sensing techniques, A. C. Tam, Reviews of Modern Physics, Vol 58, No. 2, p. 381-431 (1986)
2. Optimized Capacitive MEMS Microphone for Photoacoustic Spectroscopy (PAS) Applications, 10.1117/12.597136, Pedersen et al. (2005).
3. https://phys.org/news/2019-01-technology-lasers-transmit-audible-messages.html
4. Progress in Photothermal and Acoustic Science and Technology, Life and Earth Sciences, A. Mandelis and P. Hess, SPIE (1997).
5. Surface crack detection with low-cost photoacoustic imaging system, https://doi.org/10.14716/ijtech.v9i1.1506

The invention claimed is:

1. An apparatus for monitoring mechanical integrity of an eye-safety component of an illuminator, the apparatus comprising:
- a sensor operable to sense a photoacoustic effect in the eye-safety component during operation of the illuminator and to output a signal representative of the sensed photoacoustic effect, wherein the sensor is configured to be sensitive only to an excitation frequency of an emitter, the excitation frequency being a frequency which could cause eye safety concerns; and
- a processor operable to:
  - monitor the signal from the sensor;
  - determine if the signal comprises at least one parameter that falls outside of a pre-determined acceptable range, the pre-determined acceptable range being indicative of mechanical integrity of the eye-safety component; and
  - initiate a safety action in response to a determination that the at least one parameter falls outside of the pre-determined acceptable range thereby indicating a loss of mechanical integrity,
- wherein the eye-safety component comprises a glass substrate and/or a diffuser configured to pass a light of the illuminator, and
- wherein the sensor is configured to sense a sound wave formed by the photoacoustic effect.

2. The apparatus of claim 1 further comprising a phononic structure configured to improve a signal-to-noise ratio of the sound wave.

3. The apparatus of claim 1 wherein the processor is further operable to detect a change in environmental conditions within the illuminator based on the signal from the sensor.

4. The apparatus of claim 1 wherein the processor is operable to initiate the safety action by transmitting an instruction to the illuminator to modify an intensity of illumination and/or to cease illumination.

5. The apparatus of claim 1 wherein the sensor comprises a microphone.

6. The apparatus of claim 1 further comprising one or more of an amplifier; a filter; a lock-in detector; and an acceptable range detector.

7. The apparatus of claim 1 wherein the photoacoustic effect is a crack extending completely through the eye-safety component.

8. The apparatus of claim 1 wherein the sensor is configured to be coupled to a portion of the eye-safety component.

9. The apparatus of claim 1 wherein the processor is operable to use a gated detection method when monitoring the signal from the sensor, the signal based on a resonant frequency of the eye-safety component.

10. An illuminator comprising:
- at least one emitter;
- an eye-safety component providing a shield between the at least one emitter and a user; and an apparatus configured to monitor the mechanical integrity of the eye-safety component of the illuminator, the apparatus comprising:

a sensor operable to sense a photoacoustic effect in the eye-safety component during operation of the illuminator and to output a signal representative of the sensed photoacoustic effect; and a processor operable to:

monitor the signal from the sensor;

determine if the signal comprises at least one parameter that falls outside of a pre-determined acceptable range, the pre-determined acceptable range being indicative of mechanical integrity of the eye-safety component; and initiate a safety action in response to a determination that the at least one parameter falls outside of the pre-determined acceptable range thereby indicating a loss of mechanical integrity, wherein the eye-safety component comprises a glass substrate and/or a diffuser configured to pass a light of the illuminator, and wherein the sensor is configured to sense a sound wave formed by the photoacoustic effect, wherein the at least one emitter comprises an emitter tuned to a resonant frequency of the eye-safety component.

11. The illuminator of claim 10 further comprising a modulator configured to modulate a light output from at least one of the at least one emitter at a pre-determined frequency and wherein the processor is operable to use the pre-determined frequency in a lock-in detection method and a gated detection method when monitoring the signal from the sensor.

12. The illuminator of claim 10 wherein the at least one emitter comprises an illumination emitter and the sensor is operable to sense a photoacoustic effect resulting from operation of the illumination emitter.

13. The illuminator of claim 10 wherein the at least one emitter comprises a monitoring emitter and the sensor is operable to sense a photoacoustic effect resulting from operation of the monitoring emitter.

14. The illuminator of claim 10 wherein the sensor is arranged to sense the photoacoustic effect in the eye-safety component directly.

15. The illuminator of claim 10 wherein the sensor is arranged to sense the photoacoustic effect in the eye-safety component indirectly by receiving an input via a waveguide or other medium.

16. The illuminator of claim 10 wherein the at least one emitter comprises a laser.

17. The illuminator of claim 10 wherein the at least one emitter comprises another emitter that is not tuned to a resonant frequency of the eye-safety component.

18. A method for monitoring mechanical integrity of an eye-safety component of an illuminator, the method comprising:

obtaining, from a sensor, a signal representative of a sensed photoacoustic effect in the eye-safety component during operation of the illuminator, the signal based on an excitation frequency of an emitter, the excitation frequency being a frequency which could cause eye safety concerns;

monitoring the signal;

determining if the signal comprises at least one parameter that falls outside of a pre-determined acceptable range, the pre-determined acceptable range being indicative of mechanical integrity of the eye-safety component; and initiating a safety action in response to a determination that the at least one parameter falls outside of the pre-determined acceptable range thereby indicating a loss of mechanical integrity wherein the eye-safety component comprises a glass substrate and/or a diffuser configured to pass a light of the illuminator.

19. The method of claim 18 further comprising establishing the pre-determined acceptable range using an artificial neural network.

20. A non-transitory computer-readable medium having stored thereon program instructions for causing at least one processor to perform the method according to claim 18.

* * * * *